United States Patent
Bellows et al.

(10) Patent No.: US 7,613,873 B2
(45) Date of Patent: *Nov. 3, 2009

(54) DEFERRING REFRESHES DURING CALIBRATIONS IN MEMORY SYSTEMS

(75) Inventors: Mark David Bellows, Rochester, MN (US); Ryan Abel Heckendorf, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/031,080

(22) Filed: Feb. 14, 2008

(65) Prior Publication Data

US 2008/0140923 A1   Jun. 12, 2008

Related U.S. Application Data

(63) Continuation of application No. 10/988,313, filed on Nov. 12, 2004, now Pat. No. 7,356,642.

(51) Int. Cl.
*G06F 12/00* (2006.01)

(52) U.S. Cl. .................. 711/106; 711/105; 711/154; 365/222

(58) Field of Classification Search ................ 711/100, 711/105–106, 154; 365/222
See application file for complete search history.

(56) References Cited

U.S. PATENT DOCUMENTS

| | | | |
|---|---|---|---|
| 6,310,814 | B1 | 10/2001 | Hampel et al. |
| 6,496,437 | B2 | 12/2002 | Leung |
| 6,560,155 | B1 | 5/2003 | Hush |
| 6,931,484 | B2 | 8/2005 | Ranganathan et al. |
| 2001/0040833 | A1 | 11/2001 | Bogin et al. |

*Primary Examiner*—Jasmine Song
(74) *Attorney, Agent, or Firm*—Francis Lammes; Stephen J. Walder, Jr.; Matthew B. Talpis

(57) ABSTRACT

A memory system employs calibrations to ensure the precise transmission of data. During calibrations, memory refreshes can occur; however, these refreshes can interfere with calibration streams. Therefore, to alleviate collisions and interferences, refreshes are deferred to periods where no calibrations are taking place. The number of deferred refreshes is also tracked such that the overall loss of refreshes is prevented.

8 Claims, 3 Drawing Sheets

DEFERRING REFRESHES DURING CALIBRATIONS IN MEMORY SYSTEMS

This application is a continuation of application Ser. No. 10/988,313, filed Nov. 12, 2004, now U.S. Pat. No. 7,356,642 status allowed.

FIELD OF THE INVENTION

The present invention relates generally to Dynamic Random Access Memory (DRAM) systems, and more particularly, to memory refreshes in a DRAM system.

DESCRIPTION OF THE RELATED ART

In conventional DRAMs, synchronization can be difficult. With the introduction of Extreme Date Rate (XDR™) DRAM, which is available from Rambus, Inc., El Camino Real, Los Altos, Calif. 94022, however, on-chip alignment of data with the clock can be automatic. In addition to extremely fast data transfer rates, XDR™ memory systems employ a flexible architecture that allows automatic centering of the data and clock. Having such a dynamic phase alignment system reduces the need for precise Printed Circuit Board (PCB) timing constraints and PCB trace length matching.

Part of the phase alignment architecture employs hardware that incorporates calibrations. Calibrations are needed to ensure the precise transmission of data. Referring to FIG. 1 of the drawings, the reference numeral 100 generally designates a flow chart depicting conventional XDR™ calibrations, both initial and periodic.

The initial calibration process begins by calibrating different Input/Output (IO) devices, such as XDR™ DRAMs (XDRAMs) and XDR™ IO cell (XIO) devices, in step 102. The period of time in which the different IO devices are calibrated with respect to current and impedance is referred to as the current and impedance calibration (ICAL-ZCAL) period. Once the different IO devices have been calibrated in this way, the loading of patterns occurs in step 104 such that XDRAMs are serially loaded with the patterns and that the memory controller has the same "golden" patterns. The loaded patterns are then read from the XDRAMs and compared against the "golden" patterns. Adjustments to the XIO's data pin phases are then made to perform the receive calibration (RX_CAL) in step 106. Then, initial transmit calibration (TX_CAL) occurs in step 107 using normal writes followed by reads that enable a similar comparison as with the RX_CAL. After the initial calibration, periodic calibration events can take place between sequences of normal read and write memory operations in step 108. Also, during a power-down exit, calibrations, similar to step 102 through 107 take place.

XDRAMs, like other DRAMs, may require memory to be refreshed periodically. Sometimes a single calibration may be taking place when one or more refreshes would be issued. Since the XIO and XDRAMs are occupied by the calibration, the refreshes cannot occur. Therefore, there is a need for a method and/or apparatus that makes XDR™ calibrations and XDR™ refreshes compatible to avoid collisions, and that addresses at least some of the problems associated with conventional XDR™ calibrations.

SUMMARY OF THE INVENTION

A mechanism is provided for deferring refreshes during calibrations in a memory system. In the illustrative embodiments, a memory controller sends commands to a plurality of dynamic random access memory banks through an input/output cell. In the illustrative embodiments, the memory controller performs calibrations on the plurality of dynamic random access memory banks. In the illustrative embodiments, the memory controller performs refreshes on the plurality of dynamic random access memory banks. In the illustrative embodiments, the memory controller defers refreshes during calibrations, maintains a count of a number of deferred refreshes, decrements the count responsive to a confirmation of a completed refresh, and determines that all deferred refreshes are completed if the count reaches zero. In the illustrative embodiments, a refresh timer initiates a refresh command to initialization logic. In the illustrative embodiments, the initialization logic determines whether the memory controller is performing calibrations and, if the memory controller is performing calibrations, the initialization logic defers the refresh command and increments the count.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the illustrative embodiments of the present invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
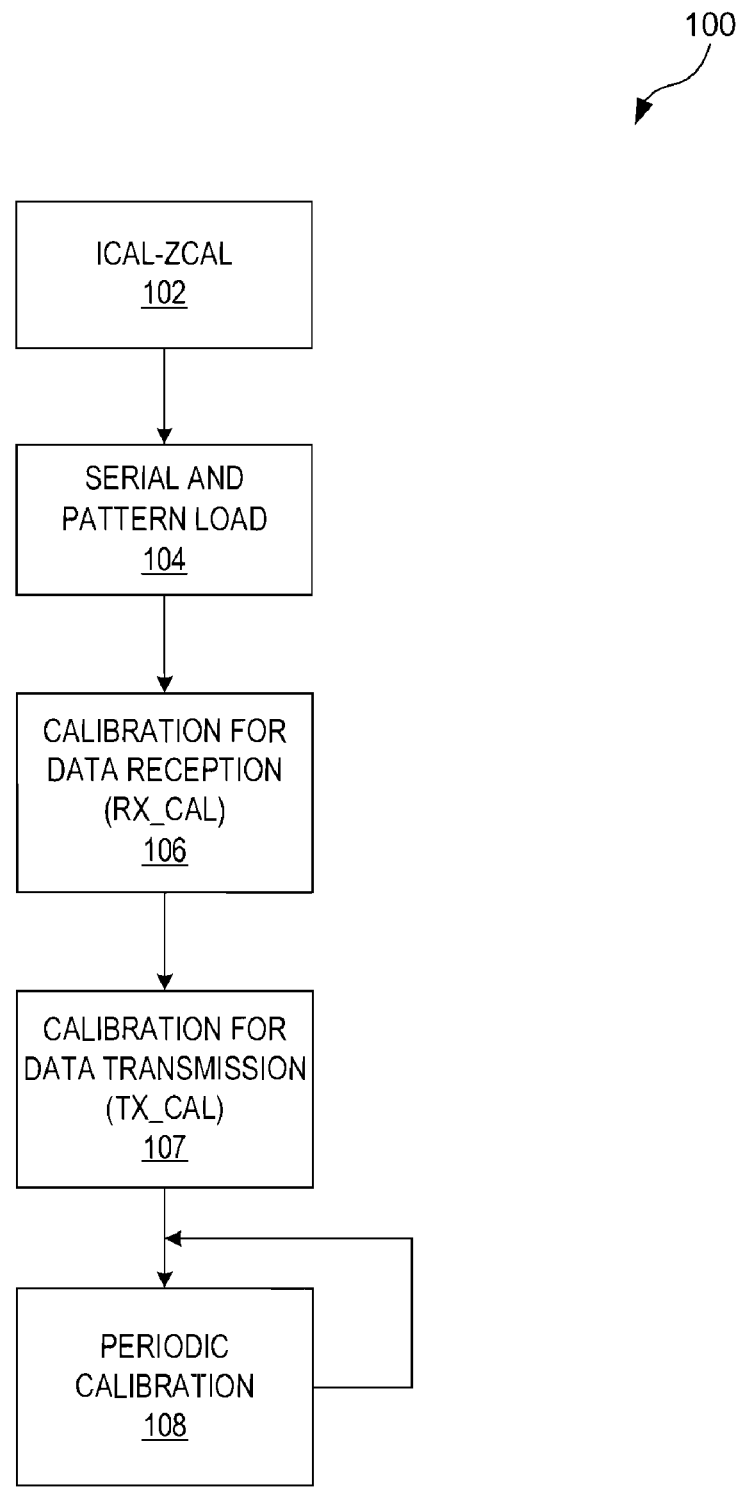
FIG. 1 is a flow chart depicting conventional XDR™ calibrations.
Figure 2:
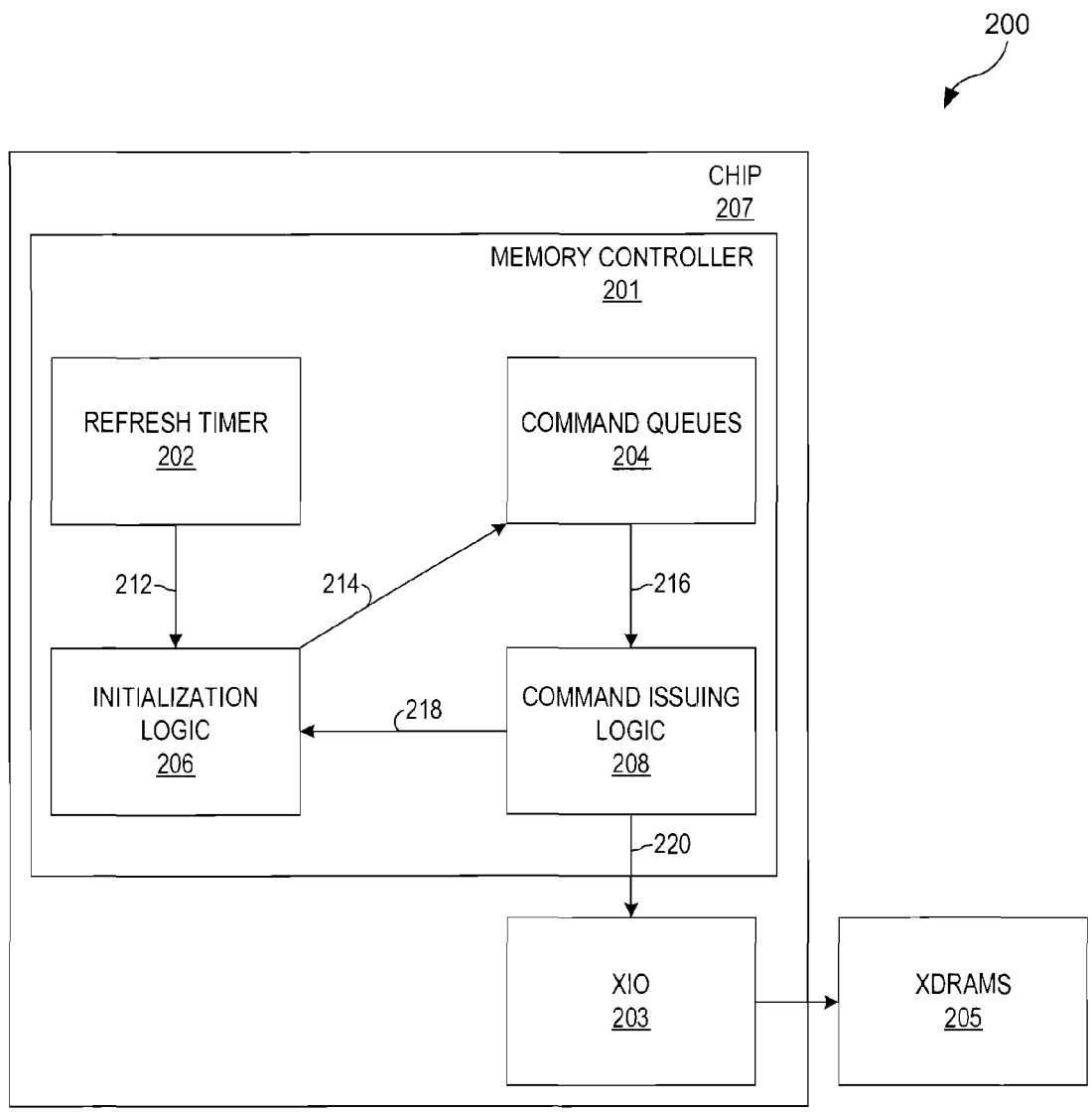
FIG. 2 is a block diagram depicting an XDR™ memory system that handles calibrations and refreshes.

Referring to FIG. 2 of the drawings, the reference numeral 200 generally designates an XDR™ memory system that handles refreshes and calibrations. The memory system 200 comprises a chip 207 and XDRAMs 205. The chip 207 further comprises a memory controller 201 and an XIO 203, and the memory controller 201 comprises a refresh timer 202, command queues 204, DRAM command issuing logic 208, and initialization logic 206.

The refresh timer 202 provides scheduled times when refreshes should be issued. The refresh timer 202 can initiate a refresh to the Initialization logic 206 through the communication channel 212. The initialization logic 206 then passes a refresh to the command queues 204 through communication channel 214. The command queues 204 then passes the refresh command to the command issuing logic 208 through the communication channel 216. Refreshes have the highest priority, but the refreshes are dependent on the readiness of the banks of the XDRAMs 205. The command issuing logic 208 can then send the command to the XIO 203 through the communication channel 220.

However, in cases where there is an active calibration, a refresh cannot be accomplished since the command queues 204, the issuing logic 208, the XIO 203, and the XDRAMs 205 are busy being directed by the initialization logic 206. Specifically, the refreshes should not interfere with the calibration streams. Patterns should be launched back-to-back to calibrate the data pins so as to have proper alignment of the data with the clock. If the refreshes interfere with the calibration streams, then gaps and reordering of predefined sequences can occur, which can result in misalignment of the data with the clock. A number of refresh timer intervals could expire during a calibration stream. Therefore, it is possible to lose refreshes.

To combat the issues related to refreshes during calibrations, the refresh timer 202 transmits the scheduled refresh to the initialization logic 206 through the communication channel 212. The initialization logic 206, though, does not immediately perform a refresh. Instead, the initialization logic 206 adds the refresh to a refresh counter (not shown) so refreshes can be issued later. Afterward, the initialization logic 206 uses the communication channel 214 to send the refresh command to the command queues 204 at an appropriate time. The deferred refresh can then be transmitted from the command queues 204 through the communication channel 216 to the command issuing logic 208. Then, the command issuing logic 208 can issue the deferred refresh to the XIO 203 through the communication channel 220. The command issuing logic 208 can then provide confirmation of a completed refresh to the initialization logic 206 through the communication channel 218 so that the count of deferred refreshes can be decremented by one.

Under the circumstances where the refreshes are deferred, the calibration streams can be preserved. Refreshes are simply stored and delayed so that ongoing calibrations can continue, uninterrupted. Once the time arises where refreshes can be safely issued, then each of the stored refreshes can be issued back-to-back to catch up. When the count of deferred refreshes reaches zero, then the system 200 is caught up with respect to the refreshes. Hence, problems of lost refreshes and refreshes that interfere with the calibration are virtually eliminated. The refresh/calibration interactions can occur during initialization, during powerdown exit, or during periodic calibrations in normal functional operation.

Figure 3:
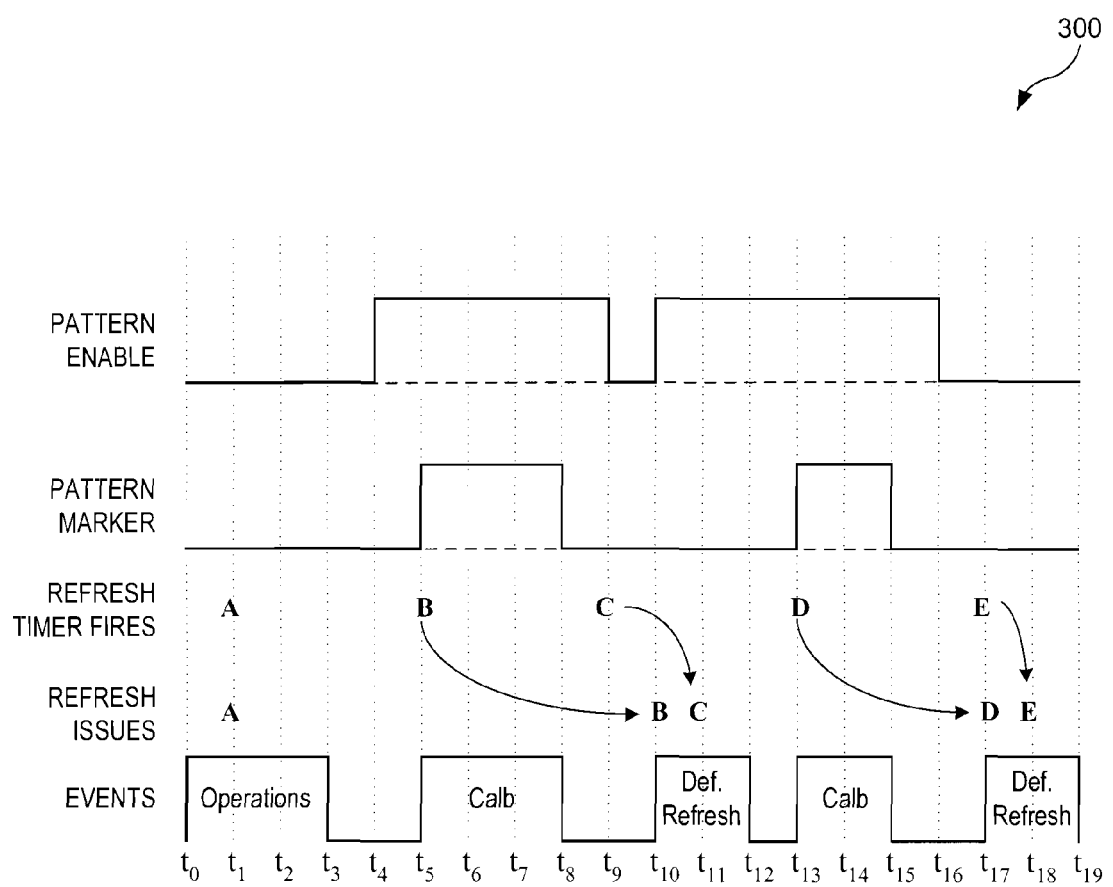
FIG. 3 is an example timing diagram depicting how refreshes are issued around calibrations.

Referring to FIG. 3 of the drawings, the reference numeral 300 generally designates an example timing diagram depicting how refreshes are issued around calibrations. The timing diagram 300 shows a pattern enable signal, a pattern marker signal, and events. The events are comprised of normal memory operations, calibrations, and deferred refreshes. The pattern enable signal is a signal from the XIO 203 indicating that a calibration is to occur, and the pattern marker signal is a signal from the memory controller 201 that the memory controller 201 is performing the sequence of commands and/or driving data for the calibration.

At $t_1$, both the pattern enable and the pattern marker are logic low. Having both the pattern enable and the pattern marker signals as logic low indicates to the system that no calibration is occuring. Additionally, at $t_1$, normal operations are occurring as events. The normal memory operations can comprise a variety of operations, such as loads, stores, and refreshes.

However, at $t_4$, the pattern enable transitions to logic high, indicating that the XIO is requesting a calibration to occur. Following the pattern enable's transition to logic high, the pattern marker transitions to logic high at $t_5$ and transitions back to logic low at $t_8$. During the period between $t_5$ and $t_8$, a calibration is executed. As a result of executing the calibration, no refreshes can be issued, causing the refreshes to be deferred.

The pattern enable signal then transitions to logic low at $t_9$ and back to logic high at $t_{10}$. At the $t_{10}$, deferred refreshes, which have not been issued, are issued due to the transition of the pattern enable signal from logic high to logic low. Between $t_{10}$ and $t_{12}$, deferred refreshes are issued. A second calibration can then occur between $t_{13}$ and $t_{15}$ once all of the deferred refreshes have been completed. During the period of calibration between $t_{13}$ and $t_{15}$, the pattern marker is logic high indicating that a calibration is occurring. Additionally, periodic calibrations are similar to initial calibrations except that the duration of a periodic calibration is usually shorter than that of an initial calibration, and periodic calibrations are more spread out in time.

As examples, there are also five refreshes A, B, C, D, and E desired at $t_1$, $t_5$, $t_9$, $t_{13}$, and $t_{17}$, respectively, that illustrate the utilization of deferred refreshes. Refresh A can be performed almost immediately at some time after $t_1$. Refreshes B and C, however, cannot be performed almost immediately. Instead, refreshes B and C are deferred to some time after $t_{10}$, during the deferred refresh period. Refreshes D and E, too, cannot be performed almost immediately and are deferred to some time after $t_{17}$, during the deferred refresh period.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A memory system, comprising:
a memory controller, comprising:
a refresh timer;
initialization logic;
one or more command queues; and
command issuing logic;
an input/output cell; and
a plurality of dynamic random access memory banks,
wherein the memory controller sends commands to the plurality of dynamic random access memory banks through the input/output cell;
wherein the memory controller performs calibrations on the plurality of dynamic random access memory banks;
wherein the memory controller performs refreshes on the plurality of dynamic random access memory banks; and
wherein the memory controller defers refreshes during calibrations, maintains a count of a number of deferred refreshes, decrements the count responsive to a confirmation of a completed refresh, and determines that all deferred refreshes are completed if the count reaches zero;
wherein the refresh timer initiates a refresh command to the initialization logic; and
wherein the initialization logic determines whether the memory controller is performing calibrations and wherein if the memory controller is performing calibrations, the initialization logic defers the refresh command and increments the count.

2. The memory system of claim 1, wherein responsive to a determination that the memory controller is not performing calibrations, the initialization logic passes the refresh command to the one or more command queues and decrements the count.

3. The memory system of claim 2, wherein the input/output cell asserts a pattern enable signal to indicate that a calibration is to occur and wherein the memory controller asserts a pattern marker signal to indicate that the memory controller is performing a sequence of commands or deriving data for calibration.

4. The memory system of claim 3, wherein the initialization logic determines whether the memory controller is performing calibrations by determining whether the pattern marker signal is asserted.

5. The memory system of claim 2, wherein the one or more command queues pass the refresh command to the command issuing logic.

6. The memory system of claim 5, wherein the command issuing logic determines whether the memory controller is performing calibrations and if the memory controller is performing calibrations, defers the refresh command.

7. The memory system of claim 1, wherein the refresh timer provides scheduled times when refreshes are to be issued.

8. The memory system of claim 1, wherein the command issuing logic is configured to issue refreshes at a configurable rate.

* * * * *